United States Patent
Lan et al.

(10) Patent No.: US 9,564,537 B2
(45) Date of Patent: *Feb. 7, 2017

(54) ARRAY SUBSTRATE AND METHOD FOR MANUFACTURING THE SAME

(71) Applicant: E Ink Holdings Inc., Hsinchu (TW)

(72) Inventors: Wei-Chou Lan, Hsinchu (TW); Ted-Hong Shinn, Hsinchu (TW); Henry Wang, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/859,371

(22) Filed: Sep. 21, 2015

(65) Prior Publication Data

US 2016/0013322 A1    Jan. 14, 2016

Related U.S. Application Data

(63) Continuation of application No. 13/530,098, filed on Jun. 21, 2012, now Pat. No. 9,165,955.

(30) Foreign Application Priority Data

Nov. 2, 2011    (TW) .............................. 100139964 A

(51) Int. Cl.
*H01L 29/786*    (2006.01)
*H01L 21/02*    (2006.01)
(Continued)

(52) U.S. Cl.
CPC ..... *H01L 29/7869* (2013.01); *H01L 21/02554* (2013.01); *H01L 21/02565* (2013.01);
(Continued)

(58) Field of Classification Search
CPC .......................... H01L 27/127; H01L 29/7869
See application file for complete search history.

(56) References Cited

U.S. PATENT DOCUMENTS 7,285,440 B2 * 10/2007 Dimitrakopoulos ... B82Y 15/00
257/E51.007
7,476,908 B2    1/2009 Yamazaki et al.
(Continued)

FOREIGN PATENT DOCUMENTS

CN    101937157 A    1/2011

*Primary Examiner* — Eugene Lee
(74) *Attorney, Agent, or Firm* — CKC & Partners Co., Ltd.

(57) ABSTRACT

Disclosed herein is a method for manufacturing an array substrate. The method includes forming a source electrode and a drain electrode on a substrate. A semiconductor layer, an organic insulating layer, and a gate electrode layer are sequentially formed to cover the substrate, the source electrode, and the drain electrode. A patterned photoresist layer is formed on the gate electrode layer. The exposed portion of the gate electrode layer, and a portion of the organic insulative layer and a portion of the semiconductor layer thereunder are removed to form a gate electrode. An organic passivation layer is formed on the gate electrode, the source electrode, and the drain electrode. The organic passivation layer has a contact window to expose a portion of the drain electrode. A pixel electrode is formed on the organic passivation layer and the exposed portion of the drain electrode.

5 Claims, 4 Drawing Sheets

(51) Int. Cl.
    *H01L 21/4763*     (2006.01)
    *H01L 29/49*     (2006.01)
    *H01L 29/51*     (2006.01)
    *H01L 29/66*     (2006.01)
    *H01L 29/24*     (2006.01)
    *H01L 27/12*     (2006.01)

(52) U.S. Cl.
    CPC .... *H01L 21/47635* (2013.01); *H01L 27/1218* (2013.01); *H01L 27/1225* (2013.01); *H01L 27/1288* (2013.01); *H01L 29/24* (2013.01); *H01L 29/4908* (2013.01); *H01L 29/51* (2013.01); *H01L 29/66969* (2013.01); *H01L 29/78603* (2013.01); *H01L 29/78606* (2013.01); *H01L 27/127* (2013.01)

(56) References Cited

U.S. PATENT DOCUMENTS

| | | | |
|---|---|---|---|
| 7,602,464 B2 | 10/2009 | Seo et al. | |
| 7,888,702 B2 | 2/2011 | Akimoto et al. | |
| 8,071,422 B2 | 12/2011 | Seo et al. | |
| 8,324,017 B2 | 12/2012 | Han | |
| 8,330,194 B2 | 12/2012 | Sato | |
| 8,368,067 B2 | 2/2013 | Uchiyama et al. | |
| 8,383,470 B2 | 2/2013 | Akimoto et al. | |
| 8,384,085 B2 | 2/2013 | Kimura et al. | |
| 8,450,736 B2* | 5/2013 | Lee et al. | 257/57 |
| 8,461,582 B2 | 6/2013 | Kimura | |
| 8,525,182 B2* | 9/2013 | Saito et al. | 257/72 |
| 9,165,955 B2* | 10/2015 | Lan et al. | |
| 2007/0108445 A1 | 5/2007 | Lan et al. | |
| 2008/0185689 A1* | 8/2008 | Kodaira | H01L 27/1266 257/620 |
| 2008/0283833 A1 | 11/2008 | Kim et al. | |
| 2009/0026445 A1 | 1/2009 | Noh et al. | |
| 2009/0057681 A1* | 3/2009 | Komatsu | H01L 27/124 257/71 |
| 2011/0115006 A1 | 5/2011 | Sato | |
| 2012/0199821 A1* | 8/2012 | Gwoziecki | H01L 51/0554 257/40 |

\* cited by examiner

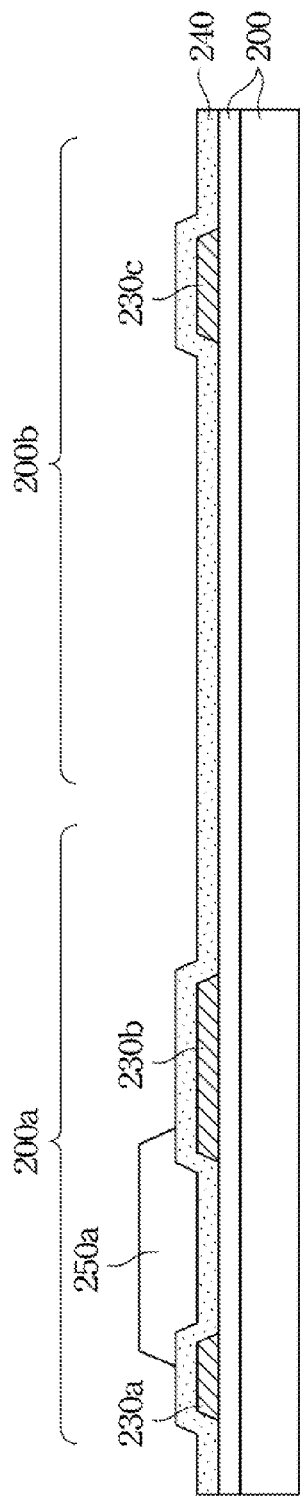
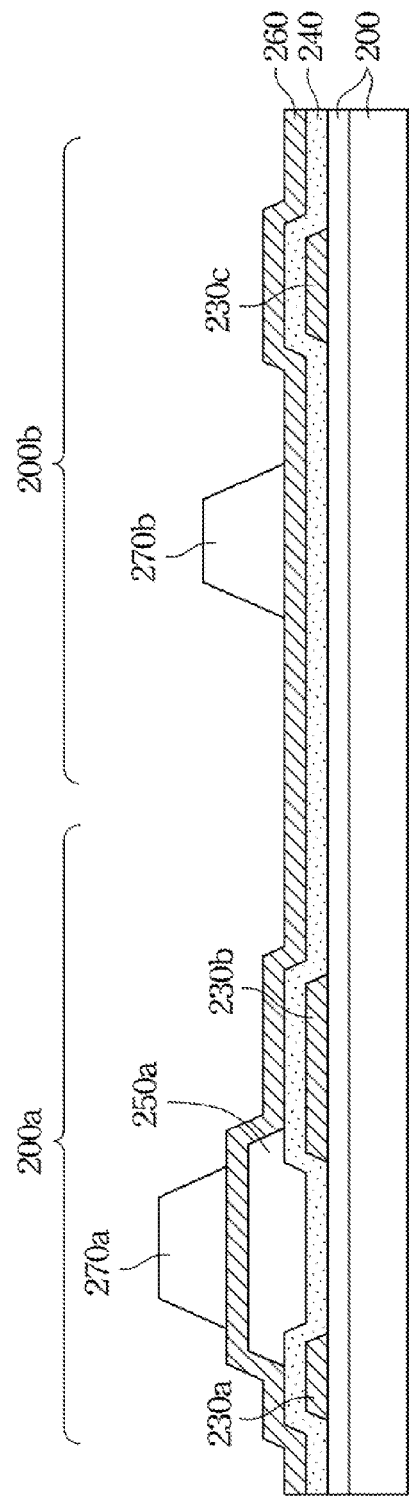

ARRAY SUBSTRATE AND METHOD FOR MANUFACTURING THE SAME

RELATED APPLICATIONS

The present application is a Continuation application of the application Ser. No. 13/530,098, filed Jun. 21, 2012, which claims priority to Taiwan Application Serial Number 100139964, filed Nov. 2, 2011, which is herein incorporated by reference.

BACKGROUND

Technical Field

The present invention relates to an array substrate and a method for manufacturing the same. More particularly, the present invention relates to an array substrate for display devices and a method for manufacturing the same.

Description of Related Art

An array substrate of a display device primarily includes thin film transistors and other electronic components. Generally, five or more photolithography process steps are employed to manufacture the array substrate. The semiconductor layer of the thin film transistor is usually made of amorphous silicon. The insulating layer is typically made of inorganic oxide or nitride such as silicon oxide and silicon nitride. However, the semiconductor layer and the insulating layer are fabricated by a chemical vapor deposition process which is carried out at a high temperature. Accordingly, the substrate must be made of a high temperature-resistant material such as glass, and thus renders the array substrate rigid and inflexible.

It is important to develop flexible display devices because the demand for flexible, lightweight, and thin display devices is increasing. The manufacture of flexible array substrates for such flexible display devices requires five to six photolithography process steps.

Therefore, there exists a need of providing an improved method that reduces the number of photolithography process steps and manufacturing costs.

SUMMARY

The following presents a summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

An aspect of the present invention provides a method for manufacturing an array substrate using four photolithography process steps.

In one or more embodiments, the method includes steps described below. A substrate is provided. A source electrode and a drain electrode are formed on the substrate. A semiconductor layer, an organic insulating layer, and a gate electrode layer are sequentially formed to cover the substrate, the source electrode, and the drain electrode. A patterned photoresist layer is formed on the gate electrode layer, and a portion of the gate electrode layer is exposed. The exposed portion of the gate electrode layer, and a portion of the organic insulative layer and a portion of the semiconductor layer under the exposed portion of the gate electrode are removed to form a gate electrode. An organic passivation layer is formed on the gate electrode, the source electrode, and the drain electrode. The organic passivation layer has a contact window to expose a portion of the drain electrode. A pixel electrode is formed on the organic passivation layer and the exposed portion of the drain electrode.

In one or more embodiments, the method includes steps described below. A substrate is provided. A source electrode and a drain electrode are formed on the substrate. A semiconductor layer is formed to cover the substrate, the source electrode and the drain electrode. A patterned organic insulating layer is formed on the semiconductor layer to define a channel layer of the semiconductor layer. A gate electrode layer is formed on the patterned organic insulating layer and the semiconductor layer. A patterned photoresist layer is formed on the gate electrode layer. The patterned photoresist layer is disposed above the patterned organic insulating layer, and a portion of the gate electrode layer is exposed. The exposed portion of the gate electrode layer and a portion of the semiconductor layer under the exposed portion of the gate electrode are removed to form a gate electrode and the channel layer. An organic passivation layer is formed on the gate electrode, the source electrode and the drain electrode. The organic passivation layer has a contact window to expose a portion of the drain electrode. A pixel electrode is formed on the organic passivation layer and the exposed portion of the drain electrode.

Another aspect of the present invention provides an array substrate which includes a substrate, a source electrode, a drain electrode, a semiconductor layer as a channel layer, an organic insulating layer as a gate insulating layer, a gate electrode, an organic passivation layer and a pixel electrode.

The source electrode and the drain electrode are disposed on the substrate. The semiconductor layer is disposed on the source electrode, the drain electrode and the substrate between the source electrode and the drain electrode. The organic insulating layer is disposed on the semiconductor layer. The gate electrode is disposed on the organic insulating layer. The organic passivation layer covers the gate electrode, the source electrode, the drain electrode and the substrate. The organic passivation layer has a contact window to expose a portion of the drain electrode. The pixel electrode is disposed on the exposed portion of the drain electrode and the organic passivation layer.

BRIEF DESCRIPTION OF THE DRAWINGS

The invention may be more fully understood by reading the following detailed description of the embodiment, with reference made to the accompanying drawings as follows:

FIGS. 2A-2D are cross-sectional views schematically illustrating process steps for manufacturing an array substrate according to another embodiment of present disclosure.

DETAILED DESCRIPTION

Figure 1A:
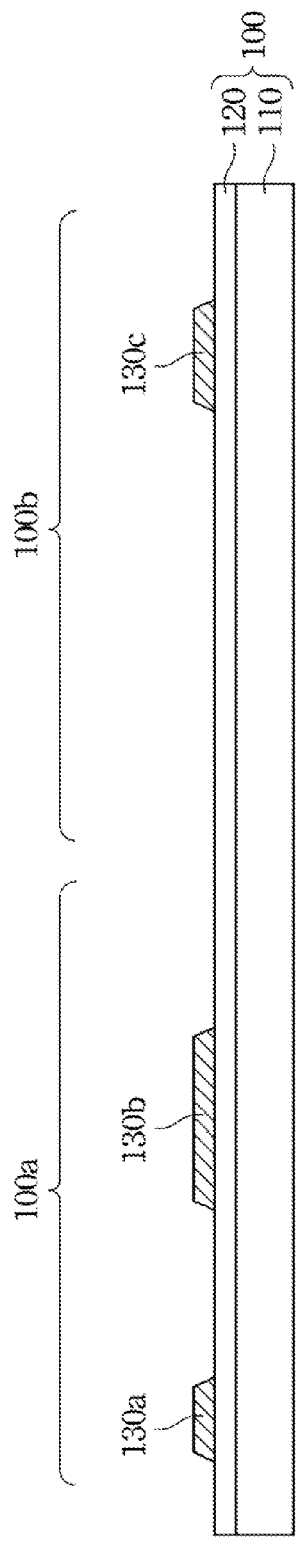
FIGS. 1A-1D are cross-sectional views schematically illustrating process steps for manufacturing an array substrate according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1D are cross-sectional views schematically illustrating process steps for manufacturing an array substrate according to one embodiment of the present disclosure. In this embodiment, the array substrate can be used in display devices, but is not limited thereto.

As depicted in FIG. 1A, a substrate 100 is provided. The substrate 100 includes a pixel area 100a and a wire area 100b. The wire area 100b is provided for fabricating circuits thereon for the purpose of connection with other electrical components such as driver ICs (integrated circuits). In one embodiment, the substrate 100 includes a rigid substrate 110 and a flexible polymer layer 120. The flexible polymer layer 120 is formed on the rigid substrate 110. The rigid substrate 110 can be a glass substrate. The flexible polymer layer 120 can be made of polyimide, polyethylene terephthalate, polyethylene naphthalate or poly(methyl methacrylate). In another embodiment, the substrate 100 does not include the flexible polymer layer 120, and comprises a glass substrate only.

After the flexible polymer layer 120 is formed on the rigid substrate 110, a source electrode 130a and a drain electrode 130b are formed on the substrate 100, as depicted in FIG. 1A. The source electrode 130a and the drain electrode 130b can be formed on the flexible polymer layer 120. The source electrode 130a is electrically connected to a signal line (not shown). As an example, the source electrode 130a can be a portion of the signal line. The source electrode 130a and the drain electrode 130b can be made of chromium, aluminum, copper, molybdenum, titanium or other conductive materials. Sputtering processes and photolithographic processes may be employed to form the source electrode 130a and the drain electrode 130b.

In one embodiment, a first connecting pad 130c is simultaneously formed in the wire area 100b while forming the source electrode 130a and the drain electrode 130b. The first connecting pad 130c is operable to connect to a driver IC (not shown) and may be electrically connected to the source electrode 130a.

Figure 1B:
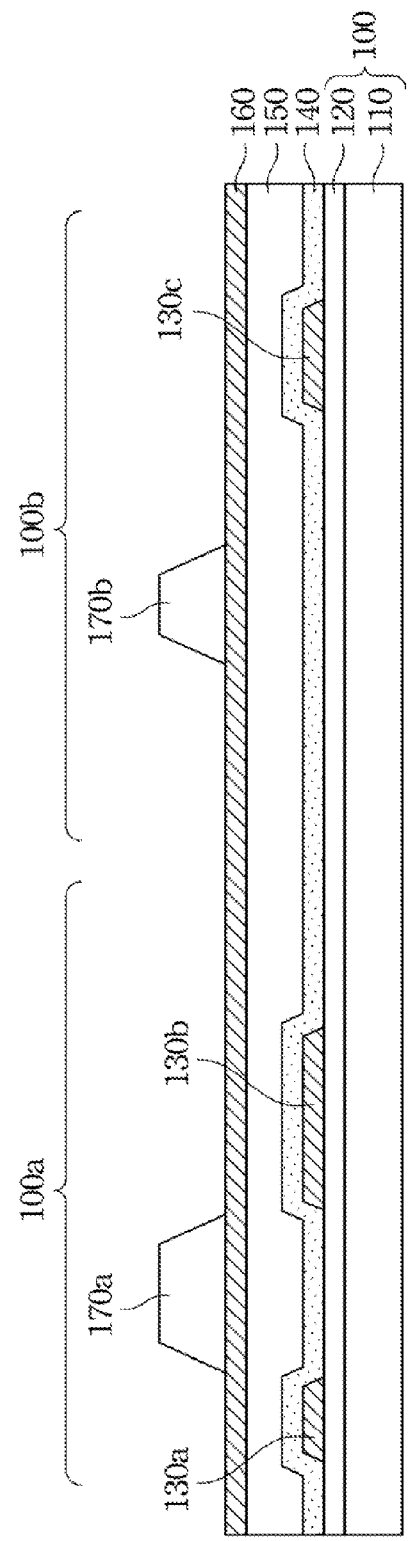

As shown in FIG. 1B, after forming the source electrode 130a and the drain electrode 130b, a metal oxide semiconductor layer 140, an organic insulating layer 150, and a gate electrode layer 160 are sequentially formed to cover the substrate 100, the source electrode 130a and the drain electrode 130b.

Suitable materials for the metal oxide semiconductor layer 140 include, but are not limited to, zinc oxide (ZnO), zinc tin oxide (ZnSnO), cadmium tin oxide (CdSnO), gallium tin oxide (GaSnO), titanium tin oxide (TiSnO), indium gallium zinc oxide (InGaZnO), copper aluminum oxide (CuAlO), strontium copper oxide (SrCuO), and lanthanum copper oxychalcogenide (LaCuOS). The metal oxide semiconductor layer 140 may be formed by a sputtering process. In the sputtering process, the metal oxide semiconductor layer 140 can be formed at ambient temperature. Therefore, in one embodiment, the metal oxide semiconductor layer 140 can be directly formed on the flexible polymer layer 120.

The organic insulating layer 150 can be made of polyimide or polysiloxane. The organic insulating layer 150 may be formed by any coating method known in the art. Compared to an inorganic insulating layer, the organic insulating layer 150 can be formed at a lower temperature. Therefore, the organic insulating layer 150 is suitable for the flexible polymer layer 120 that usually exhibits a poor thermal resistance.

The material of the gate electrode layer 160 may be the same as or different from that of each of the source electrode 130a and the drain electrode 130b. The organic insulating layer 150 is disposed between the gate electrode layer 160 and the metal oxide semiconductor layer 140 to prevent the gate electrode layer 160 from being in contact with the metal oxide semiconductor layer 140.

Next, a patterned photoresist layer 170a is formed on the gate electrode layer 160, as depicted in FIG. 1B. The patterned photoresist layer 170a is provided for defining the pattern and the position of a gate electrode 160a, which will be described below with reference to FIG. 1C. Therefore, the patterned photoresist layer 170a is disposed at a position directly above where it is desired to form the gate electrode 160a. The patterned photoresist layer 170a may be formed by any photolithography process known in the art.

In one embodiment, a patterned photoresist layer 170b is simultaneously formed in the wire area 100b while forming the patterned photoresist layer 170a. The patterned photoresist layer 170b is used to define a pattern of a second connecting pad 160b, which is described in detail hereinafter with reference to FIG. 1C.

Figure 1C:
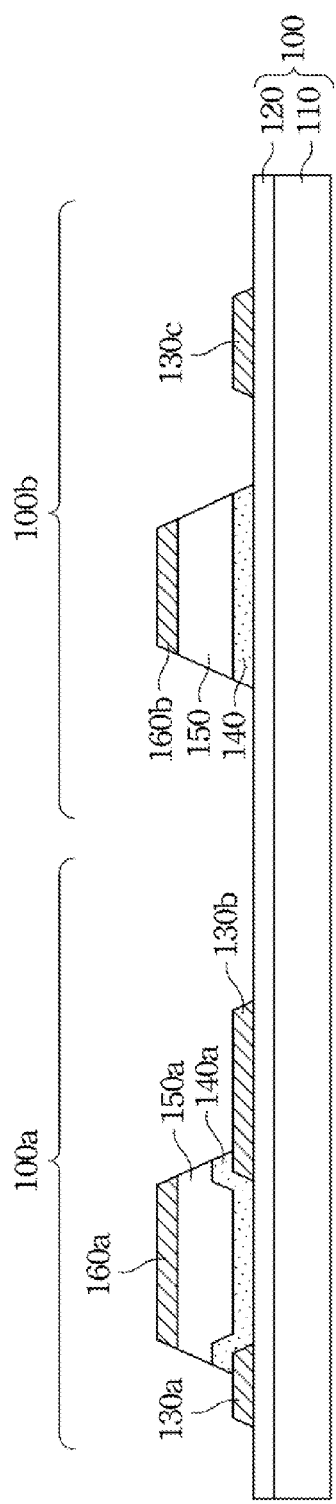

After forming the patterned photoresist layer 170a, the exposed portion of the gate electrode layer 160 (i.e., the portion that is not covered by the patterned photoresist layer 170a), and a portion of the organic insulating layer 150 and a portion of the metal oxide semiconductor layer 140 under the exposed portion of the gate electrode layer 160 are removed to form the gate electrode 160a, a gate insulating layer 150a and a channel layer 140a, as depicted in FIG. 1C. The gate electrode 160a may be electrically connected to a scan line (not shown). For example, the gate electrode 160a can be a part of the scan line.

Either a wet etching process using an acid etchant or a dry etching process may be employed to remove the exposed portion of the gate electrode layer 160, and the portions of the organic insulating layer 150 and the metal oxide semiconductor layer 140 beneath the exposed portion of the gate electrode layer 160. Specifically, an identical etchant can be used to etch the gate electrode layer 160, the organic layer 150 and the metal oxide semiconductor layer 140 so as to reduce the number of processing steps. Therefore, the gate electrode 160a, the gate insulating layer 150a and the channel layer 140a can be formed by using only one photolithography process step, and thus the gate electrode 160a, the gate insulating layer 150a and the channel layer 140a have a substantially identical pattern. Through such a process, manufacturing costs may be reduced. After the steps described above are completed, the patterned photoresist layer 170a may be removed.

In another embodiment, the exposed portion of the gate electrode layer 160 may be removed by a wet etching process using an acid etchant so as to expose a portion of the organic insulating layer 150 thereunder. Sequentially, either a dry etching process or a developing solution may be applied to remove the exposed portion of the organic insulating layer 150, after which a wet etching process using an acid etchant may be employed to dissolve an exposed portion of the metal oxide semiconductor layer 140.

In one embodiment, the second connecting pad 160b is simultaneously formed in the wire area 100b while removing the portions of the gate electrode layer 160, the organic insulating layer 150 and the metal oxide semiconductor layer 140. In other words, the second connecting pad 160b, the gate electrode 160a, the gate insulating layer 150a and the channel layer 140a are simultaneously formed. In the embodiment, the second connecting pad 160b is operable to connect to a driver IC (not shown) and may be electrically connected to the gate electrode 160a.

Figure 1D:
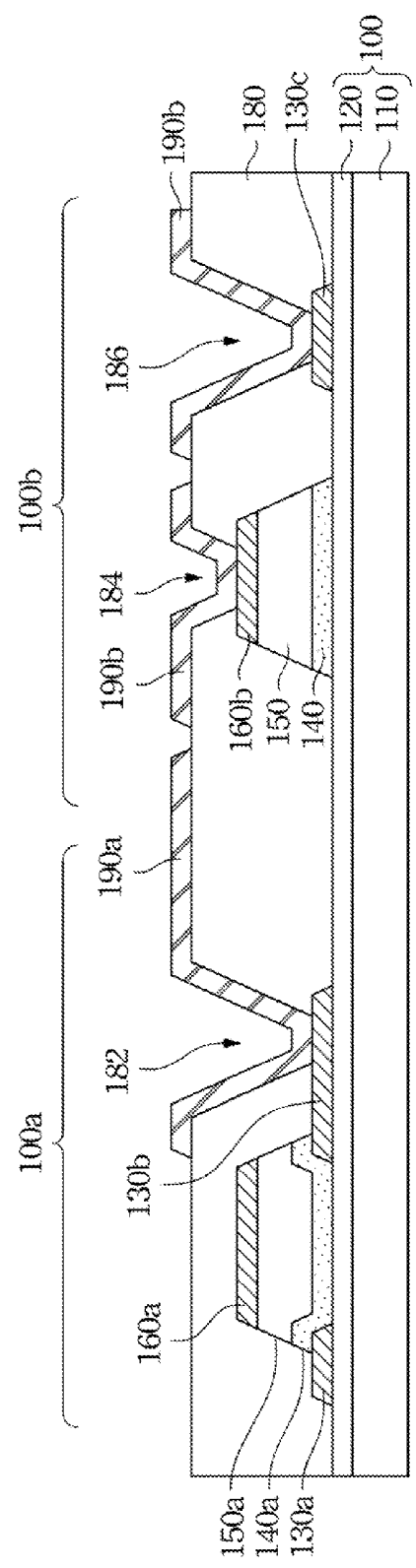

Subsequently, as depicted in FIG. 1D, an organic passivation layer 180 is formed on the gate electrode 160a, the source electrode 130a and the drain electrode 130b after forming the gate electrode 160a, the gate insulating layer 150a and the channel layer 140a. The organic passivation layer 180 has a contact window 182 to expose a portion of the drain electrode 130b. The material of the organic passivation layer 180 may be the same as or different from that of the organic insulating layer 150. As an example, the organic passivation layer 180 may be made of polyimide or polysiloxane. The organic passivation layer 180 may be formed by photolithography processes known in the art.

In one embodiment, the organic passivation layer 180 may have a first opening 184 and a second opening 186 positioned in the wire area 100b. The first and the second openings 184, 186 respectively expose the second connecting pad 160b and the first connecting pad 130c.

After forming the organic passivation layer 180, a pixel electrode 190a is formed on the organic passivation layer 180 in contact with the exposed portion of the drain electrode 130b. The pixel electrode 190a is electrically connected to the drain electrode 130b through the contact window 182. The pixel electrode 190a may be made of indium tin oxide, indium zinc oxide or other transparent conductive materials.

In one embodiment, a transparent conductive layer 190b is simultaneously formed on the organic passivation layer 180 while forming the pixel electrode 190a. In particular, the transparent conductive layer 190b is in contact with the first and second connecting pads 130c, 160b through the second and the first openings 186, 184 respectively. The portion of the transparent conductive layer 190b within the first opening 184 is operable to connect with a scan driver IC, whereas the portion of the transparent conductive layer 190b within the second opening 186 is operable to connect with a data driver IC.

In one embodiment, after performing the steps described above, the rigid substrate 110 is separated from the flexible polymer layer 120 so that an active array formed on the flexible polymer layer 120 is obtained. For instance, the rigid substrate 110 and the flexible polymer layer 120 may be separated from each other by irradiating an excimer laser beam onto the interface between the rigid substrate 110 and the flexible polymer layer 120, thereby obtaining a flexible array substrate.

FIGS. 2A-2D are cross-sectional views schematically illustrating process steps for manufacturing an array substrate according to another embodiment of this invention. In this embodiment, the array substrate can be used in display devices, but is not limited thereto.

Firstly, a source electrode 230a and a drain electrode 230b are formed on a substrate 200, as depicted in FIG. 2A. The substrate 200 includes a pixel area 200a and a wire area 200b. The wire area 200b is provided for fabricating circuits thereon for the purpose of connection with other electrical components. The materials of the substrate 200, the source electrode 230a and the drain electrode 230b as well as the fabricating method thereof may be the same as those described above in connection with FIG. 1A.

In one embodiment, a first connecting pad 230c can be simultaneously formed in the wire area 200b while forming the source electrode 230a and the drain electrode 230b.

Next, a metal oxide semiconductor layer 240 is formed on the substrate 200, the source electrode 230a and the drain electrode 230b, as depicted in FIG. 2A. The method of forming the metal oxide semiconductor layer 240 and the material thereof may be the same as the metal oxide semiconductor layer 140 described above in connection with FIG. 1B.

Figure 2C:
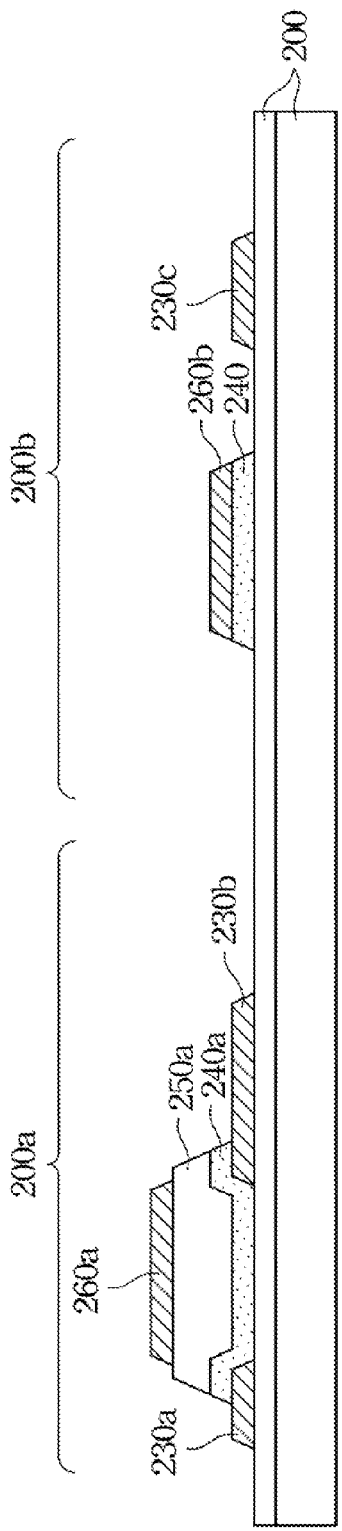

Subsequently, a patterned organic insulating layer 250a is formed on the metal oxide semiconductor layer 240 to define a pattern of a channel layer 240a in the metal oxide semiconductor layer 240, as depicted in FIG. 2A (the channel layer 240a will be described below with reference to FIG. 2C). Specifically, a photosensitive organic insulating material can be coated on the metal oxide semiconductor layer 240 and then the coating is baked. Next, exposure and development processes are performed to form the patterned organic insulating layer 250a. The wavelength of the light used in the exposure process may be adjusted, depending on the material used for the organic insulating layer 250a. The wavelength of the exposing light is typically in the range of visible light to ultraviolet light such as G-line (436 nm), H-line (405 nm) and I-line (365 nm). As an example, the organic insulating layer 250a may be made of photosensitive organic insulating materials such as polyimide and polysiloxane.

With reference to FIG. 2B, after the patterned organic insulating layer 250a is formed, a gate electrode layer 260 is formed to cover the patterned organic insulating layer 250a and the metal oxide semiconductor layer 240. The method of forming the gate electrode layer 260 and the materials thereof may be the same as the gate electrode layer 160 described above in connection with FIG. 1B.

Next, a patterned photoresist layer 270a is formed on the gate electrode layer 260, as depicted in FIG. 2B. The patterned photoresist layer 270a is provided to define a pattern of a gate electrode 260a, which may be located directly above the patterned organic insulating layer 250a and which is described below with reference to FIG. 2C. The method of forming the patterned photoresist layer 270a and the material thereof may be the same as the patterned photoresist layer 170a described above in connection with FIG. 1B.

In one embodiment, a patterned photoresist layer 270b is simultaneously formed in the wire area 200b while forming the patterned photoresist layer 270a. The patterned photoresist layer 270b can be used to define a second connecting pad 260b, which will be described in more detail hereinafter with reference to FIG. 2C.

After the patterned photoresist layer 270a is formed, the exposed portion of the gate electrode layer 260 (i.e., that is not covered by the patterned photoresist layer 270a) and a portion of the metal oxide semiconductor layer 240 thereunder are selectively removed to form the gate electrode 260a and the channel layer 240a, as depicted in FIG. 2C. In one example, the exposed portion of the gate electrode layer 260 and the portion of the metal oxide semiconductor layer 240 thereunder may be etched by an identical etchant in one step so as to reduce processing steps. During the etching process, the patterned organic insulating layer 250a defines the pattern of the channel layer 240a. Therefore, the channel layer 240a and the patterned organic insulating layer 250a have a substantially identical pattern in a top view. In one example, the area of the gate electrode 260a is slightly less than the area of the patterned organic insulating layer 250a. After performing the steps described above, the patterned photoresist layer 270b may be removed.

In one embodiment, the second connecting pad 260b is simultaneously formed in the wire area 200b while removing the exposed portion of the gate electrode layer 260 and the portion of the metal oxide semiconductor layer 240 thereunder.

Figure 2D:
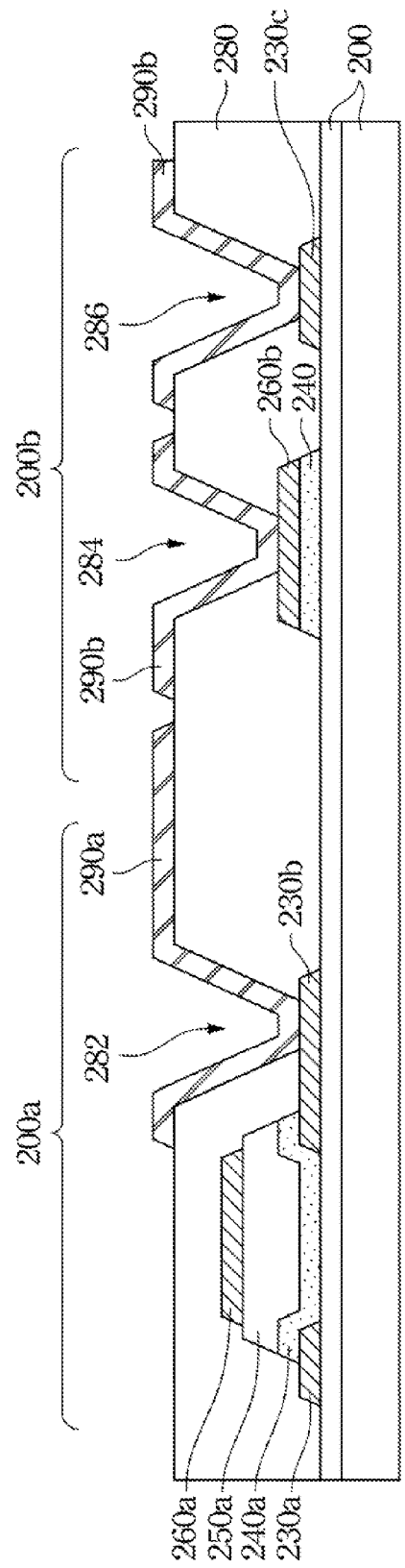

With reference to FIG. 2D, an organic passivation layer 280 is formed on the gate electrode 260a, the source electrode 230a and the drain electrode 230b after forming the gate electrode 260a and the channel layer 240a. The organic passivation layer 280 has a contact window 282 to expose the drain electrode 230b. The method of forming the organic passivation layer 280 and the material thereof may be the same as the organic passivation layer 180 described above in connection with FIG. 1D.

In one embodiment, the organic passivation layer 280 may have a first opening 284 and a second opening 286 in the wire area 200b to expose the second connecting pad 260b and the first connecting pad 230c, respectively.

After forming the organic passivation layer 280, with reference to FIG. 2D, a pixel electrode 290a is formed on the organic passivation layer 280 and the exposed portion of the drain electrode 230b so that the pixel electrode 290a is electrically connected to the drain electrode 230b through the contact window 282. The method of forming the pixel electrode 290a and the material thereof may be the same as the pixel electrode 190a described above in connection with FIG. 1D.

In one embodiment, a transparent conductive layer 290b is formed on the organic passivation layer 280 while forming the pixel electrode 290a. In particular, the transparent conductive layer 290b is in contact with first and second connecting pads 230c, 260b through the second and the first openings 286, 284 respectively. The portion of the transparent conductive layer 290b within the first opening 284 is operable to connect with a scan driver IC, whereas the portion of the transparent conductive layer 290b within the second opening 286 is operable to connect with a data driver IC.

One of features of the embodiment described above is that the patterned organic insulating layer 250a for defining the pattern of the channel layer 240a is formed prior to forming the gate electrode layer 260. Therefore, the gate electrode layer 260 and the metal oxide semiconductor layer 240 may be patterned in one etching step using an identical etchant when the patterned organic insulating layer 250a is made of a material having a sufficient resistance to the etchant. Accordingly, the processing steps may be reduced.

Another aspect of the present invention provides an array substrate for display devices. As depicted in FIG. 1D, the array substrate for display devices includes a substrate 100, a source electrode 130a, a drain electrode 130b, a metal oxide semiconductor layer (i.e., the channel layer 140a), an organic insulating layer (i.e., the gate insulating layer 150a), a gate electrode 160a, an organic passivation layer 180 and a pixel electrode 190a. The source electrode 130a and the drain electrode 130b are disposed on the substrate 100. The metal oxide semiconductor layer (i.e., the channel layer 140a) is disposed on the source electrode 130a, the drain electrode 130b and a portion of the substrate 100 between the source and the drain electrodes 130a, 130b. The organic insulating layer (i.e., the gate insulating layer 150a) is disposed on the channel layer 140a. The gate electrode 160a is disposed on the organic insulating layer. The organic passivation layer 150a covers the gate electrode 160a, the source electrode 130a, the drain electrode 130b and the substrate 100. The organic passivation layer 150a has a contact window 182 to expose a portion of the drain electrode 130b. The pixel electrode 190a is disposed on the organic passivation layer 180 and the exposed portion of the drain electrode 130b so that the pixel electrode 190a is electrically connected to the drain electrode 130b through the contact window 182.

In view of the above, the array substrate for display devices may be manufacture by only four photolithography process steps according to the embodiments disclosed herein, and thus the number of processing steps and manufacturing costs are reduced, and productivity is enhanced. Besides, the organic insulating layer and the organic passivation layer can be formed at a low temperature, such that manufacturing costs are decreased. Furthermore, the structure comprised of the organic insulating layer, the organic passivation layer and the metal oxide semiconductor layer allows the active element of the array substrate to have a higher electron mobility.

The array substrate disclosed herein can be applied in flexible display devices such as organic light emitting diode display devices (OLEDs) and eletrophoretic display devices. In one example, the array substrate disclosed herein may be combined with organic light emitting diode components or eletrophoretic elements to design and manufacture flexible OLEDs or flexible eletrophoretic display devices. Through use of the array substrate disclosed herein, the productivity of such devices may be increased and the manufacturing costs thereof may be reduced.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims.

What is claimed is:

1. An array substrate, comprising:
   a substrate comprising a flexible polymer layer, wherein the substrate comprises a pixel area and a wire area separated from each other;
   a source electrode and a drain electrode disposed on the pixel area of the substrate, wherein the source electrode and the drain electrode are disposed on the flexible polymer layer;
   a first connecting pad disposed on the wire area of the substrate;
   a semiconductor layer disposed on the substrate, wherein a portion of the semiconductor layer disposed on the source electrode, the drain electrode and the pixel area of the substrate, and another portion of the semiconductor layer disposed on the wire area of the substrate and separated from the first connecting pad;
   an organic insulating layer disposed on the portion of the semiconductor layer, wherein a sidewall of the portion of the semiconductor layer is continuous with a sidewall of the organic insulating layer;
   a gate electrode disposed on the organic insulating layer, wherein an area of the gate electrode is less than an area of the organic insulating layer, and the sidewall of the organic insulating layer is not continuous with a sidewall of the gate electrode;
   a second connecting pad disposed on the another portion of the semiconductor layer;
   an organic passivation layer covering the gate electrode, the source electrode, the drain electrode, the first connecting pad, the second connecting pad and the substrate, wherein the organic passivation layer has three contact windows to respectively expose a portion of the drain electrode, a portion of the connecting pad and a portion of the second connecting pad;
   a pixel electrode disposed on the organic passivation layer and electrically connected to the drain electrode through one of the three contact windows; and a conductive layer on the organic passivation layer and electrically connected to the first connecting pad and the second connecting pad through the other two of the three contact windows.

2. The array substrate of claim 1, wherein the semiconductor layer comprises a material selected from the group consisting of ZnSnO, CdSnO, GaSnO, TiSnO, CuAlO, SrCuO and LaCuOS.

3. The array substrate of claim 1, wherein the organic insulating layer comprises polysiloxane.

4. The array substrate of claim 1, wherein the organic passivation layer comprises polyimide or polysiloxane.

5. The array substrate of claim 1, wherein the flexible polymer layer is made of polyethylene terephthalate, polyethylene naphthalate or poly(methyl methacrylate).

* * * * *